United States Patent
Engstrom

(10) Patent No.: US 8,945,250 B2
(45) Date of Patent: Feb. 3, 2015

(54) COATED CUTTING TOOL INSERT FOR TURNING OF STEELS

(75) Inventor: Hindrik Engstrom, Soderbarke (SE)

(73) Assignee: Seco Tools AB, Fagersta (SE)

( * ) Notice: Subject to any disclaimer, the term of this patent is extended or adjusted under 35 U.S.C. 154(b) by 289 days.

(21) Appl. No.: 13/387,436

(22) PCT Filed: Jun. 29, 2010

(86) PCT No.: PCT/SE2010/050742
§ 371 (c)(1), (2), (4) Date: Feb. 27, 2012

(87) PCT Pub. No.: WO2011/014110
PCT Pub. Date: Feb. 3, 2011

(65) Prior Publication Data
US 2012/0144965 A1     Jun. 14, 2012

(30) Foreign Application Priority Data
Jul. 27, 2009   (SE) ...................................... 0901037

(51) Int. Cl.
B23B 27/14          (2006.01)
C23C 30/00          (2006.01)
(Continued)

(52) U.S. Cl.
CPC ........... *C23C 30/005* (2013.01); *C23C 16/0272* (2013.01); *C23C 16/403* (2013.01); *B23B 2222/84* (2013.01); *B23B 2224/04* (2013.01); *B23B 2228/10* (2013.01)
USPC ............... 51/307; 51/309; 428/216; 428/336; 428/472; 428/697; 428/698; 428/699; 428/701

(58) Field of Classification Search
USPC ........... 51/307, 309; 428/216, 336, 472, 697, 428/698, 699, 701, 702
See application file for complete search history.

(56) References Cited

U.S. PATENT DOCUMENTS

| | | | |
|---|---|---|---|
| 5,958,569 | A | 9/1999 | Leverenz et al. |
| 5,980,988 | A | 11/1999 | Ljungberg |
| 6,139,921 | A | 10/2000 | Taschner et al. |

(Continued)

FOREIGN PATENT DOCUMENTS

| | | |
|---|---|---|
| CN | 1978192 A | 6/2007 |
| EP | 1795628 A1 | 6/2007 |

(Continued)

OTHER PUBLICATIONS

Production of Cemented Carbide, Zhuzhou Cemented Carbide Factory, Metallurgical Industry Press, Jun. 30, 1974, pp. 402-403 and 444-446.

(Continued)

*Primary Examiner* — Archene Turner
(74) *Attorney, Agent, or Firm* — Young & Thompson

(57) ABSTRACT

A cutting tool insert for turning of hardened steels and tool steels includes a textured CVD α-Al$_2$O$_3$ coated cemented carbide body. The cemented carbide body has 4.0-7.0 wt-% Co and 0.25-0.50 wt-% Cr and an S-value of 0.68-0.88 and a coercivity (Hc) of 28-38 kA/m. The α-Al$_2$O$_3$ layer has a thickness ranging from 7 to 12 μm, is composed of columnar grains having a length/width ratio from 2 to 12 and is deposited on an MTCVD Ti(C,N) layer having a thickness from 4 to 12 μm. The alumina layer is characterised by a pronounced (006) growth texture.

21 Claims, 1 Drawing Sheet

Figure 1:
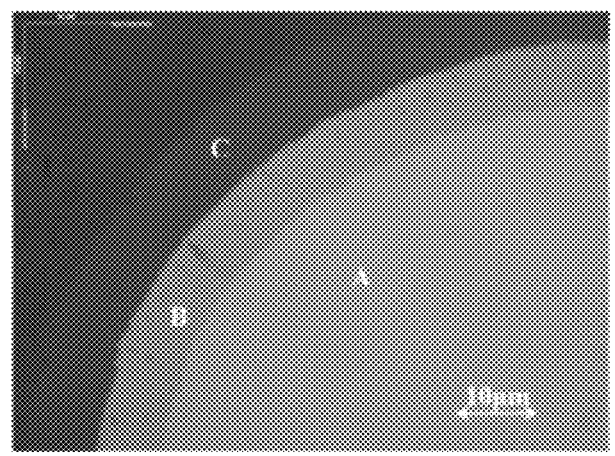

(51) Int. Cl.
*C23C 16/02* (2006.01)
*C23C 16/40* (2006.01)

(56) References Cited

U.S. PATENT DOCUMENTS

| | | | |
|---|---|---|---|
| 6,214,287 B1* | 4/2001 | Waldenstrom | 75/240 |
| 6,273,930 B1* | 8/2001 | Waldenstrom | 75/240 |
| 7,201,956 B2 | 4/2007 | Oshika et al. | |
| 7,985,471 B2* | 7/2011 | Zackrisson et al. | 428/698 |
| 7,989,092 B2* | 8/2011 | Sundstrom et al. | 51/307 |
| 7,993,742 B2* | 8/2011 | Ruppi | 428/325 |
| 8,187,698 B2* | 5/2012 | Sundstrom et al. | 428/336 |
| 2007/0104945 A1 | 5/2007 | Ruppi | |
| 2009/0016831 A1 | 1/2009 | Sundstrom et al. | |
| 2009/0017289 A1 | 1/2009 | Zackrisson et al. | |

FOREIGN PATENT DOCUMENTS

| | | |
|---|---|---|
| EP | 1 953 258 A1 | 8/2008 |
| EP | 2 014 789 A1 | 1/2009 |
| RU | 2130823 C1 | 5/1999 |
| RU | 2173471 C2 | 9/2001 |
| RU | 2210622 C2 | 8/2003 |
| WO | 2008094104 A1 | 8/2008 |
| WO | 2008094105 A1 | 8/2008 |
| WO | 2010071585 A1 | 6/2010 |

OTHER PUBLICATIONS

International Search Report, dated Oct. 28, 2010, from corresponding PCT application.
Russian Decision on Grant, dated Jul. 4, 2014, from corresponding RU application.

* cited by examiner

COATED CUTTING TOOL INSERT FOR TURNING OF STEELS

BACKGROUND OF THE INVENTION

1. Field of the Invention

The present invention relates to coated cutting tool insert particularly useful for turning of hardened steels and tool steels. Hard fine grained substrate in combination with a CVD-coating greatly improves the wear resistance. The coating is composed of one or more refractory layers of which at least one layer is a textured alpha-alumina ($\alpha$-$Al_2O_3$).

2. Description of the Related Art

US 2009/017289 relates to a cutting tool insert for turning of steel at high cutting speeds. The cutting tool insert comprises a (006) textured $\alpha$-$Al_2O_3$ coated by chemical vapour deposition on a cemented carbide substrate.

US 2009/016831 relates to a coated cutting tool insert, particularly useful for turning of heat resistant super alloys, utilizing a hard low Co-content submicron grain sized substrate in combination with a thin, very hard single (Ti,Si)N-layer grown using physical vapour deposition.

U.S. Pat. No. 7,201,956 relates to a cutting tool composed of tungsten carbide-based cemented carbide or titanium carbonitride-based cermet, and a hard coating layer provided on the surface thereof; wherein the hard coating layer includes an aluminum oxide layer having an alpha crystal structure, with the highest peak in the inclination section of the (0001) plane of crystal grains relative to the normal of the surface.

Hardened steels cover a broad range of steels and properties and exist in many different conditions depending on purpose of use. As quenched, quenched and tempered, surface hardened (case hardened, nitrided, etc) are common conditions covering a hardness range up to 68 HRC. However, the purpose is to increase strength and wear resistance through obtaining different microstructures of the steels.

Steels suitable for hardening are medium to high carbon steels often with alloying additions of Cr, Ni, Mn and Mo. Depending on purpose, other alloying elements are added. Many of these alloying elements are carbide formers creating hard abrasive particles in the steels, which beside the high hardness, further decrease machinability and increase the wear on the cutting edge.

As strength and hardness are increased, the result is increased cutting forces and increased wear on the cutting edge during machining.

When cemented carbide cutting tools are used in the machining of hardened steels, the tool is worn by different mechanisms such as abrasive and chemical wear, chipping and fracturing of the cutting edge. For a coated tool insert normally having thin surface layers of wear resistant carbide, nitride, carbonitride and/or oxide compounds formed by various vapour deposition techniques, the coating contributes to increase the abrasive wear resistance, but it also acts as a thermal barrier for the diffusion of heat from the cutting surface into the underlying cemented carbide substrate. A high temperature within the edge region in combination with high cutting forces result in an increase of the creep deformation within the affected surface region of the substrate and the cutting edge deforms plastically. Inserts for machining of hardened steel must have good deformation resistance, wear resistance and toughness.

SUMMARY OF THE INVENTION

It is therefore an object of the present invention to provide a cutting tool insert with good deformation resistance, wear resistance and toughness.

It is a further object of the present invention to provide a coated cemented carbide for medium and rough machining of hardened steels with improved wear resistance in both wet and dry conditions.

It has now surprisingly been found that a cemented carbide with low Co-content and submicron grain size with a coating comprising a (006) textured alumina layer post treated by wet blasting, grown using chemical vapor deposition, greatly improves the productivity compared to existing cemented carbide based cutting tools at, medium and rough machining of hardened steels under wet and dry conditions.

BRIEF DESCRIPTION OF THE DRAWING FIGURES

Figure 2:
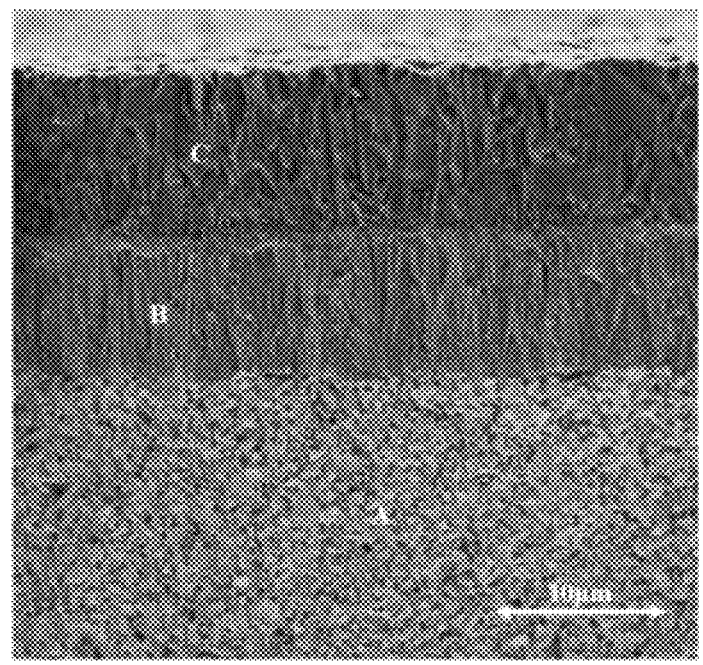

FIG. 1 shows a cross sectional light optical microscope image of a coated insert according to the present invention and FIG. 2 shows a cross sectional scanning electron microscope image of a coated insert according to the present invention, where A interior of the substrate, B titaniumcarbonitride layer and C alumina layer.

DETAILED DESCRIPTION OF THE INVENTION

According to the present invention there is now provided a coated cutting tool insert consisting of a substrate and a coating. The substrate consists of WC, 4.0-7.0 wt-% Co, preferably 4.5-6.0 wt-% Co, 0.25-0.50 wt-% Cr, preferably 0.30-0.45 wt-% Cr, an S-value of 0.68-0.88, preferably 0.7-0.8, and a coercivity (Hc) of 28-38 kA/m, preferably 30-34 kA/m. The S-value is $=\sigma/16.1$, where $\sigma$ is the measured magnetic moment of the binder phase in $\mu Tm^3kg^{-1}$. Preferably, the edge radius before coating is between 15 and 50 µm.

The coating comprises an MTCVD Ti(C,N)-layer with columnar grains as the first layer adjacent the substrate having a thickness of from 4 to 12 µm, preferably from 5 to 10 µm. On top of the MTCVD layer an $\alpha$-$Al_2O_3$ layer is deposited. Preferably, the MTCVD-layer includes an innermost finegrained TiN layer of <3 µm, preferably 0.1-1.5 µm, adjacent to the substrate with a Ti(C,N) layer on top. More preferably, said Ti(C,N)-layer is followed by a finegrained TiN layer having a thickness of about 0.1-2 µm, preferably 0.1-0.5 µm, which is followed by a finegrained Ti(C,N)-layer 0.1-1.5 µm thick. The first MTCVD Ti(C,N) layer adjacent the substrate can be substituted by MTCVD Ti(C,O,N), CVD Ti(C, N) or CVD TiN or two or more of MTCVD Ti(C,N) MTCVD Ti(C,O,N), CVD Ti(C,N) or CVD TiN.

The $\alpha$-$Al_2O_3$ layer consists of nucleated $\alpha$-$Al_2O_3$. The thickness of the alumina layer is from 7 to 12 µm, preferably 8 to 11 µm. The alumina layer is composed of columnar grains with a (006) texture, having a length/width ratio of from 2 to 12, preferably 4 to 8. The $\alpha$-$Al_2O_3$ layer is the uppermost layer. Typically, the surface roughness is Ra<1.0 µm, preferably 0.3-0.7 µm.

The texture coefficients (TC) for the α-Al$_2$O$_3$ layer is determined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=intensity of the (hkl) reflection.
I$_0$(hkl)=standard intensity according to JCPDS card no 46-1212.
n=number of reflections used in the calculation·(hkl) reflections used are: (012), (104), (110), (006), (113), (202), (024) and (116).
The texture of the alumina layer is as follows:
TC(006)>2, preferably >4 and <8. Simultaneously, TC(012), TC(110), TC(113), TC(202), TC(024) and TC(116) are all <1 and TC(104) is the second highest texture coefficient. In a preferred embodiment TC(104)<2 and >0.5.

The total coating thickness is between 11 and 24 μm, preferably between 13 and 21 μm.

The coated cutting tool insert according to the present invention consisting of a substrate and a coating is made in the following way: The substrate is made by conventional powder metallurgical methods milling, pressing and sintering. It has a composition of WC, 4.0-7.0 wt-% Co, preferably 4.5-6.0 wt-% Co, 0.25-0.50 wt-% Cr, preferably 0.30-0.45 wt-% Cr, and an S-value of 0.68-0.88, preferably 0.7-0.8, a coercivity (Hc) of 28-38, preferably 30-34 kA/m.

Before coating the inserts are preferably edge-honed by wet-brushing to an edge radius of preferably between 15 and 50 μm.

The cemented carbide insert is coated with a Ti(C,N) layer and possibly intermediate layers by CVD and/or MTCVD. Subsequently, a CVD process incorporating several different deposition steps, is used to nucleate α-Al$_2$O$_3$ at a temperature of 1000° C. In these steps the composition of a CO$_2$+CO+H$_2$+N$_2$ gas mixture is controlled to result in an O-potential required to achieve (006) texture. The α-Al$_2$O$_3$ layer is then deposited by conventional CVD at 1000° C. The exact conditions depend on the design of the coating equipment being used. It is within the purview of the skilled artisan to determine the gas mixture in accordance with the present invention.

Suitably, the α-Al$_2$O$_3$ layer is post treated with a surface polishing method, preferably wet-blasting, in order to decrease the surface roughness.

The present invention also relates to the use of inserts according to above for medium and rough machining of hardened steels and tool steels with a hardness ranging from 40 HRC to 60 HRC under wet and dry conditions at a cutting speed of 70-250 m/min, a cutting depth 0.3-3 mm and a feed of 0.1-0.6 mm/rev.

EXAMPLE 1

Cemented carbide inserts of type WNMGF080612-MF5 and RPHW1204MOT-MD10 were produced according to the invention by conventional milling of the raw material powders, pressing of the green compacts and subsequent sintering at about 1400° C. The inserts were also subjected to edge preparation by wet brushing to about 35 μm and dimensional grinding. Data for the inserts after sintering is shown in table 1.

TABLE 1

| Composition and physical data. | | | | | |
|---|---|---|---|---|---|
| Substrate | Co, wt-% | Cr, wt-% | WC | Coercivity, kA/m | S-value |
| A | 5.0 | 0.35 | rest | 32.0 | 0.8 |

EXAMPLE 2

Coatings

Inserts from Example 1 were MTCVD and CVD coated.

First a 0.4 μm fine-grained TiN-layer was deposited by 850° C. Then a layer of columnar Ti(C,N) was deposited by MTCVD using acetonitrile as a carbon/nitrogen source at 850° C. The MTCVD-process was interrupted and a 0.3 μm fine-grained CVD-TiN-layer 6 μm from the cemented carbide surface, followed by a 0.3 μm finegrained CVD-TiCN-layer. In the following steps an alumina layer was deposited and the composition of the CO$_2$+CO+H$_2$+N$_2$ gas mixture was controlled to result in an O-potential required to achieve (006) texture. The thickness of the different layers was controlled by the deposition time. The coated inserts were analyzed by light optical and scanning electron microscopy and by X-ray diffraction. The thickness and texture coefficients for the layers are shown in table 2. FIG. 1 shows a cross sectional light optical microscope image of a coated insert and FIG. 2 an electron microscope image.

TABLE 2

| Thickness and texture coefficients of the layers | | | | | | | | | |
|---|---|---|---|---|---|---|---|---|---|
| Coating | TiCN, μm | α-Al$_2$O$_3$, μm | TC (012) | TC (104) | TC (110) | TC (006) | TC (113) | TC (202) | TC (024) | TC (116) |
| a | 6 | 10 | 0.23 | 1.14 | 0.23 | 4.96 | 0.13 | 0.46 | 0.21 | 0.64 |
| b | 7 | 9 | 0.27 | 1.23 | 0.15 | 5.31 | 0.11 | 0.35 | 0.18 | 0.40 |

EXAMPLE 3

Coated inserts from Example 1 were tested with regard to wear resistance at the following conditions. As reference a Seco ISO K10 grade, denoted B, was used. As another reference a Seco ISO P10 grade, denoted C was used. Both commonly used grades for the mentioned application.

Application: Facing of cylindrical bar
Material: DIN 34CrNiMo6 hardened (Q&T) to 43 HRC
Cutting speed: 190 m/min
Feed: 0.3 mm/rev
Depth of cut: 2 mm
Remarks: Coolant The tool life criterion was flank wear of 0.3 mm, and the number of facings was counted for each grade. The results are found in Table 3.

TABLE 3

| Grade | Number of facings |
|---|---|
| Invention (Aa) | 80 |
| B | 50 |
| C | 30 |

This test shows that the inserts according to the invention achieve about 60% longer tool life than existing recommended grades.

EXAMPLE 4

Coated inserts from Example 1 were tested with regard to wear resistance at the following conditions. As reference a Seco ISO K10 grade, denoted B, was used. As another reference a Seco ISO P10 grade, denoted C was used. Both commonly used grades for the mentioned application.
  Application: Facing of cylindrical bar
  Material: Tool steel AISI H13, hardened to 50 HRC.
  Cutting speed: 110 m/min
  Feed: 0.3 mm/rev
  Depth of cut: 2 mm
  Remarks: Coolant
  Results
Tool life criterion was flank wear of 0.3 mm. The results are found in Table 4.

TABLE 4

| Grade | Number of facings | Flank wear, mm |
|---|---|---|
| Invention (Aa) | 40 | 0.23 |
| B | 40 | 0.32 |
| C | 20 | 0.38 |

This test shows that the inserts according to the invention increase tool life about 40% compared to existing recommended grades.

EXAMPLE 5

Coated inserts from Example 1 (Ab) were tested with regard to wear resistance and toughness at the following conditions. As reference a ceramic grade intended for the application from a competitor was used.
  Application: Longitudinal turning of cylindrical bar
  Material: Through hardened 50CrMo4 (surface hardness of 58 HRC)
  Cutting speed, vc: 120 or 147 m/min
  Feed: 0.28 mm/rev
  Depth of cut: 0.5 mm
  Remarks: Dry
The results are found in Table 5.

TABLE 5

| Grade | Number of passes vc = 120 m/min | Number of passes vc = 147 m/min |
|---|---|---|
| Invention (Ab) | 5 | 4 |
| Competitor ceramic | 2 | 1 |

The reference grade machined two passes over the work material with severe notches in the edge line and bad chip control as result. The inserts according to the invention managed to machine five passes still with good chip control and maintained surface finish. This test shows that the inserts according to the invention increase tool life and speed capability compared to the reference.

The invention claimed is:

1. A cutting tool insert, comprising:
  a cemented carbide body that comprises WC, 4.0-7.0 wt-% Co, 0.25-0.50 wt-% Cr, having an S-value of 0.68-0.88, and a coercivity, Hc, of 28-38 kA/m;
  and adjacent
  a coating between 11 and 24 µm thick deposited by CVD wherein at least the uppermost layer is a 7-12 µm thick α-Al$_2$O$_3$ alumina layer textured in the <006>-direction with a texture coefficient TC(006) >2, TC(012), TC(110), TC(113), TC(202), TC(024) and TC(116) all <1, and TC(104) being a second highest texture coefficient, the texture coefficient TC(hkl) being defined by:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
  I(hkl)=measured intensity of the (hkl) reflection,
  I$_0$(hkl)=standard intensity according to JCPDS card no. 46-1212,
  n=number of reflections used in the calculation (8),
  (hkl) reflections used are: (012), (104), (110), (006), (113), (202), (024) and (116).

2. The cutting tool insert according to claim 1, wherein TC(104)<2 and >0.5.

3. The cutting tool insert according to claim 1, wherein the alumina layer is composed of columnar grains having a length/width ratio of 2-12.

4. The cutting tool insert according to claim 1, wherein the coating further comprises a first layer adjacent the cemented carbide substrate having a thickness of 4-12 µm of MTCVD Ti(C,N) being composed of columnar grains.

5. Cutting The cutting tool insert according to claim 4, wherein said first layer includes an innermost finegrained TiN layer <3 µm thick adjacent to the substrate.

6. The cutting tool insert according to claim 4, wherein said first layer is followed by a finegrained TiN layer having a thickness of about 0.1-2 µm, which is followed by a finegrained Ti(C,N)-layer 0.1-1.5 µm thick.

7. The cutting tool insert according to claim 4, wherein said first MTCVD Ti(C,N) layer is replaced by MTCVD Ti(C,O,N), MTCVD TiN, CVD Ti(C,N), or CVD TiN or two or more of MTCVD Ti(C,N), MTCVD Ti(C,O,N), MTCVD TiN, CVD Ti(C,N) or CVD TiN.

8. The cutting tool insert according to claim 1, wherein the α-Al$_2$O$_3$ layer is the uppermost layer and with an R$_a$ value <1.0 µm.

9. The cutting tool insert according to claim 1, wherein an edge radius of the cemented carbide before coating is between 15 and 50 µm.

10. A process for turning of hardened steels and tool steels with a hardness ranging from 40 HRC to 60 HRC, which comprises:
  providing a cutting tool having a cutting tool insert according to claim 1; and machining the hardened steels with said cutting tool under wet and dry conditions at a cutting speed of 70-250 m/min, a cutting depth 0.3-3 mm and a feed of 0.1-0.6 mm/rev.

11. The cutting tool insert according to claim 1, wherein the cemented carbide body contains 4.5 to less than 6 wt-% Co, 0.30-0.45 wt-% Cr, the S-value is 0.7-0.8 and the coercivity Hc is 30-34 KA/m.

12. The cutting tool insert according to claim 1, wherein the uppermost layer is 8-11 μm thick, and the texture coefficient TC(006) is >4 and <8.

13. The cutting tool insert according to claim 1, wherein the alumina layer is composed of columnar grains having a length/width ratio of 4-8.

14. The cutting tool insert according to claim 1, wherein the coating further comprises a first layer adjacent the cemented carbide substrate having a thickness of 5-10 μm of MTCVD Ti(C,N) being composed of columnar grains.

15. The cutting tool insert according to claim 14, wherein said first layer includes an innermost finegrained TiN layer 0.1-1.5 μm thick adjacent to the substrate.

16. The cutting tool insert according to claim 14, wherein said first layer is followed by a finegrained TiN layer having a thickness of about 0.1-0.5 μm, which is followed by a finegrained Ti(C,N)-layer 0.1-1.5 μm thick.

17. A cutting tool insert, comprising:
a cemented carbide body that comprises WC, 4.0-7.0 wt-% Co 0.30-0.45 wt-% Cr, having an S-value of 0.7-0.8, and a coercivity, Hc, of 30-34 kA/m;
a first layer on the cemented carbide substrate having a thickness of 5-10 μm of MTCVD Ti(C,N) being composed of columnar grains; and
a second layer between 11 and 24 μm thick deposited by CVD wherein the second layer is a 8-11 μm thick α-Al$_2$O$_3$ alumina layer composed of columnar grains having a length/width ratio of 4-8, the alumina layer being textured in the <006>-direction with a texture coefficient TC(006) >4 and <8, TC(012), TC(110), TC(113), TC(202), TC(024) and TC(116) all <1, and TC(104) being a second highest texture coefficient, the texture coefficient TC(hkl) being defined by:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=measured intensity of the (hkl) reflection,
I$_0$(hkl)=standard intensity according to JCPDS card no. 46-1212,
n=number of reflections used in calculation (8),
(hkl) reflections used are: (012), (104), (110), (006), (113), (202), (024) and (116).

18. The cutting tool insert according to claim 17, wherein said first layer includes an innermost finegrained TiN layer <3 μm thick adjacent to the substrate.

19. The cutting tool insert according to claim 17, wherein said first layer is followed by a finegrained TiN layer having a thickness of about 0.1-2 μm which is followed by a finegrained Ti(C,N)-layer 0.1-1.5 μm thick.

20. The cutting tool insert according to claim 17, wherein said first MTCVD Ti(C,N) layer is replaced by MTCVD Ti(C,O,N), MTCVD TiN, CVD Ti(C,N), or CVD TiN or two or more of MTCVD Ti(C,N), MTCVD Ti(C,O,N), MTCVD TiN, CVD Ti(C,N) or CVD TiN.

21. A cutting tool insert, comprising:
a cemented carbide body that comprises WC, 4.0 to less than 6 wt-% Co, 0.25-0.50 wt-% Cr, having an S-value of 0.68-0.88, and a coercivity, Hc, of 28-38 kA/m;
and adjacent
a coating between 11 and 24 μm thick deposited by CVD wherein at least the uppermost layer is a 7-12 μm thick α-Al$_2$O$_3$ alumina layer textured in the <006>-direction with a texture coefficient TC(006) >2, TC(012), TC(110), TC(113), TC(202), TC(024) and TC(116) all <1, and TC(104) being a second highest texture coefficient, the texture coefficient TC(hkl) being defined by:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=measured intensity of the (hkl) reflection,
I$_0$(hkl)=standard intensity according to JCPDS card no. 46-1212,
n=number of reflections used in the calculation (8),
(hkl) reflections used are: (012), (104), (110), (006), (113), (202), (024) and (116).

* * * * *